United States Patent
Iso

(10) Patent No.: US 6,710,289 B2
(45) Date of Patent: Mar. 23, 2004

(54) LASER PROCESSING APPARATUS AND METHOD

(75) Inventor: Keiji Iso, Hiratsuka (JP)

(73) Assignee: Sumitomo Heavy Industries, Ltd., Tokyo (JP)

(*) Notice: Subject to any disclaimer, the term of this patent is extended or adjusted under 35 U.S.C. 154(b) by 0 days.

(21) Appl. No.: 10/418,282

(22) Filed: Apr. 18, 2003

(65) Prior Publication Data

US 2003/0205561 A1 Nov. 6, 2003

Related U.S. Application Data

(62) Division of application No. 09/877,030, filed on Jun. 11, 2001, now Pat. No. 6,580,055.

(30) Foreign Application Priority Data

Jun. 9, 2000 (JP) ........................................ 2000-173244

(51) Int. Cl.[7] .............................................. B23K 26/38
(52) U.S. Cl. ................................................. 219/121.7
(58) Field of Search ..................... 219/121.7, 121.71, 219/121.72, 121.63, 121.64, 121.65, 121.66, 121.67, 121.68, 121.69, 121.78, 121.79, 121.61, 121.76

(56) References Cited

U.S. PATENT DOCUMENTS

| 4,789,770 A | 12/1988 | Kasner et al. |
|---|---|---|
| 4,839,497 A | 6/1989 | Sankar et al. |
| 4,870,244 A | 9/1989 | Copley et al. |
| 4,925,523 A | 5/1990 | Braren et al. |
| 5,126,532 A | 6/1992 | Inagawa et al. |
| 5,202,004 A * | 4/1993 | Kwak et al. ............. 205/790.5 |
| 5,841,099 A | 11/1998 | Owen et al. |
| 6,150,629 A | 11/2000 | Sievers |
| 6,300,630 B1 * | 10/2001 | Veneklasen ................. 250/310 |
| 6,437,283 B1 | 8/2002 | Wiggermann et al. |

FOREIGN PATENT DOCUMENTS

| EP | 342836 | 11/1989 |
|---|---|---|
| EP | 884128 | 12/1998 |
| JP | 58-147690 | 4/1983 |
| JP | 04-190988 | 7/1992 |
| JP | 08-340165 | 12/1996 |
| JP | 01-302881 | 12/1999 |
| WO | WO 01/19146 | 3/2001 |

OTHER PUBLICATIONS

P. Francis et al., "Design Issues for Prepaid Data Service," draft–francis–prepaid–00.txt, IETF Internet Draft, Jun. 2002.

* cited by examiner

*Primary Examiner*—M. Alexandra Elve
*Assistant Examiner*—Jonathan Johnson
(74) *Attorney, Agent, or Firm*—Squire, Sanders & Dempsey L.L.P.

(57) ABSTRACT

A controller outputs a first event signal having a periodical waveform and a second event signal having a periodical waveform synchronizing with the first event signal. A first laser source radiates a first pulse laser beam having a wavelength in an ultraviolet range, synchronously with the first event signal. A second laser source radiates a second pulse laser beam having a wavelength in the ultraviolet range, synchronously with the second event signal. A converging optical system converges the first and second pulse laser beams at the same point. A holder holds a workpiece at a position where a pulse laser beam converged by the converging optical system is applied.

4 Claims, 6 Drawing Sheets

LASER PROCESSING APPARATUS AND METHOD

This is a Division of application Ser. No. 09/877,030 flied Jun. 11, 2001, now U.S. Pat. No. 6,580,055. The disclosure of the prior application(s) is hereby incorporated by reference herein in its entirety.

This application is based on Japanese Patent Application 2000-173244, filed on Jun. 9, 2000, the entire contents of which are incorporated herein by reference.

BACKGROUND OF THE INVENTION a) Field of the Invention

The present invention relates to a laser processing apparatus and method, and more particularly to a laser processing apparatus and method for applying a pulse laser beam having a wavelength in an ultraviolet range to a workpiece and forming a hole in or through the workpiece.

b) Description of the Related Art

A conventional laser processing method will be described by taking as an example a method of forming a hole in or through a multi-layer wiring substrate. An infrared pulse laser beam radiated from a carbon dioxide gas laser oscillator is converged at a resin layer of a multi-layer wiring substrate. Organic substance in the region applied with the laser beam is thermally decomposed and a hole is formed in this region. With this method, a through hole 100 to 200 $\mu$m in diameter can be formed through a resin layer about 40 to 80 $\mu$m thick. A carbon dioxide gas laser oscillator can radiate a pulse laser beam having a high energy per one pulse. This pulse laser beam can form a through hole, for example, by three shots.

Holes having shorter diameters are desired to be formed in a multi-layer wiring substrate of a semiconductor integrated circuit device which is implemented at a higher integration density. A lower limit of the diameter of a hole is about five times the wavelength of a laser beam used. If a carbon dioxide laser is used, the lower limit of a hole is about 50 $\mu$m. It is practically difficult to form a hole having a diameter smaller than 50 to 60 $\mu$m by using a carbon dioxide gas laser.

If a laser beam having a wavelength in the ultraviolet range is used, a hole having a smaller diameter can be formed. It is difficult, however, to generate a laser beam having a wavelength in the ultraviolet range and a large power. If a laser beam having a small power is used for processing a multi-layer wiring substrate, a process time prolongs and productivity lowers.

SUMMARY OF THE INVENTION

It is an object of the present invention to provide a laser processing apparatus and method capable of shortening a process time by using a laser beam having a wavelength in the ultraviolet range.

According to one aspect of the present invention, there is provided a laser processing apparatus comprising: controller for outputting a first event signal having a periodical waveform and a second event signal having a periodical waveform synchronizing with the first event signal; a first laser source for radiating a first pulse laser beam having a wavelength in an ultraviolet range, synchronously with the first event signal; a second laser source for radiating a second pulse laser beam having a wavelength in the ultraviolet range, synchronously with the second event signal; a converging optical system for converging the first and second pulse laser beams at a same point; and holder for holding a workpiece at a position where a pulse laser beam converged by the converging optical system is applied.

According to another aspect of the present invention, there is provided a laser processing method comprising the steps of: radiating a first pulse laser beam from a first laser source, the first pulse laser beam having a wavelength in an ultraviolet range; radiating a second pulse laser beam from a second laser source synchronously with the first pulse laser beam, the second pulse laser beam having a wavelength in the ultraviolet range; and applying the first and second pulse laser beams to a same processing area of a workpiece to form a hole in the same processing area.

When the pulses of the first and second pulse laser beams are alternately applied to the same point of a workpiece, a process speed can be approximately doubled. When the pulses of the first and second pulse laser beams are overlapped, the energy per one pulse can be increased so that a workpiece can be processed which requires a large energy for forming a hole.

According to another aspect of the present invention, there is provided a laser processing method comprising the steps of: preparing a workpiece having a first layer and a second layer formed under the first layer, wherein a hole can be formed in the first layer by applying an ultraviolet pulse laser beam having a first energy per one pulse, and a hole can be formed in the second layer by applying an ultraviolet pulse laser beam having not the first energy per one pulse but a second energy per one pulse higher than the first energy; applying a first pulse laser beam and a second pulse laser beam to the first layer in a processing area thereof under a timing condition that pulses of the first and second pulse laser beams are alternately applied to the first layer, to form a first hole in the first layer and expose a partial surface of the second layer under the first layer, the first pulse laser beam being radiated from a first laser source and having a wavelength in an ultraviolet range, and the second pulse laser beam being radiated from a second laser source and having a wavelength in the ultraviolet range; and applying the first and second pulse laser beams to the second layer exposed on a bottom of the first hole under a timing condition that pulses of the first and second pulse laser beams are at least partially overlapped, to form a second hole in the second layer, the first pulse laser beam being radiated from the first laser source and having the wavelength in the ultraviolet range, and the second pulse laser beam being radiated from the second laser source and having the wavelength in the ultraviolet range.

By chanting the timing conditions of the first and second pulse laser beams, the first and second layers can be processed continuously.

According to another aspect of the present invention, there is provided a laser processing apparatus comprising: controller for outputting a first event signal having a periodical waveform and a second event signal having a periodical waveform synchronizing with the first event signal; a first laser source for radiating a first pulse laser beam having a wavelength in an infrared or visual range, synchronously with the first event signal; a second laser source for radiating a second pulse laser beam having a wavelength in the infrared or visual range, synchronously with the second event signal; an optical propagation system for changing an optical axis of at least one of the first and second laser beams so as to make the first and second pulse laser beams propagate along a same optical axis; a non-linear optical component for generating a harmonic wave having a wavelength in an ultraviolet range, from the first and second pulse laser beams made to have the same optical axis by the optical propagation system; a converging optical system for converging the harmonic wave; and holder for holding a workpiece at a position where the harmonic wave converged by the converging optical system is applied.

As the pulses of the first and second pulse laser beams alternately reach the non-linear optical component, a harmonic wave is generated having a repetition frequency twice as high as the repetition frequency of each of the input pulse laser beams. A process time can therefore be shortened. When the pulses of the first and second pulse laser beams are overlapped and become incident upon the non-linear optical component, the energy per one pulse of the harmonic wave increases so that a workpiece can be processed which requires a large energy for forming a hole.

As above, by combining the pulse laser beams radiated from the two laser sources to have a predetermined phase difference, the hole forming time can be shortened. By overlapping the pulses of the first and second pulse laser beams, the energy per one pulse can be increased. Even if a sufficient energy per one pulse cannot be obtained by one laser source, a sufficient energy can be obtained by using two laser sources. A hole can be formed in a workpiece even if it requires a large energy per one pulse.

DETAILED DESCRIPTION OF THE PREFERRED EMBODIMENTS

Figure 1:
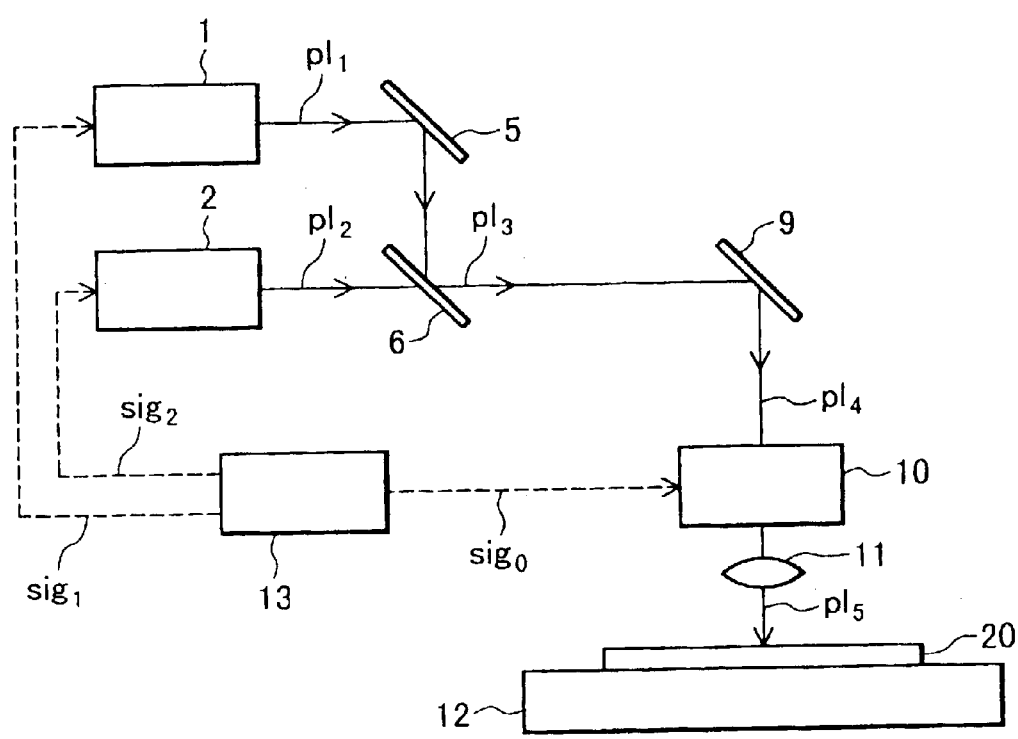
FIG. 1 is a block diagram showing a laser processing apparatus according to an embodiment of the invention.

FIG. 1 is a block diagram showing a laser processing apparatus according to an embodiment of the invention. First and second laser sources 1 and 2 radiate pulse laser beams $pl_1$ and $pl_2$ having a wavelength in the ultraviolet range, synchronously with event signals $sig_1$ and $sig_2$. The first and second laser sources 1 and 2 each include, for example, an Nd:YAG laser oscillator and non-linear optical components. The pulse laser beams $pl_1$ and $pl_2$ each are, for example, a third harmonic wave (355 nm in wavelength) of a pulse laser beam radiated from an Nd:YAG laser oscillator. The pulse laser beams $pl_1$ and $pl_2$ are linearly polarized, respectively in vertical and horizontal directions.

The pulse laser beam $pl_1$ radiated from the first laser source 1 is reflected by a turn-around mirror 5 and becomes incident upon the front surface of a polarizer 6 at an incidence angle of 45°. The pulse laser beam $pl_2$ radiated from the second laser source 2 is incident upon the back surface of the polarizer 6 at an incidence angle of 45°. The polarizer 6 reflects the pulse laser beam $pl_1$ which was linearly polarized in the vertical direction, and transmits the pulse laser beam $pl_2$ which was linearly polarized in the horizontal direction.

The pulse laser beams $pl_1$ and $pl_2$ are combined on the same optical axis by the polarizer 6 to form a pulse laser beam $pl_3$. The pulse laser beam $pl_3$ is reflected by a turn-around mirror 9. The reflected pulse laser beam $pl_4$ becomes incident upon a galvano scanner 10. The galvano scanner 10 scans the optical axis of the pulse laser beam $pl_4$ in a two-dimensional direction in response to a command signal $sig_0$.

The pulse laser beam passed through the galvano scanner 10 is converged by a converging lens 11 to form a pulse laser beam $pl_5$. For example, the converging lens 11 is an fθ lens. A workpiece 20 is held by a holder 12 at a converging position of the pulse laser beam $pl_5$.

A control unit 13 supplies the first and second laser sources 1 and 2 with the event signals $sig_1$ and $sig_2$ having a periodical waveform. The control unit 13 selects one of first and second control modes and can supply the event signals $sig_1$ and $sig_2$ having a phase difference specific to each control mode. The control unit 13 also supplies the galvano scanner 10 with the control signal $sig_0$.

Next, with reference to FIGS. 2 and 3, timings of the pulse laser beams used by the laser processing apparatus shown in FIG. 1 will be described.

Figure 2:
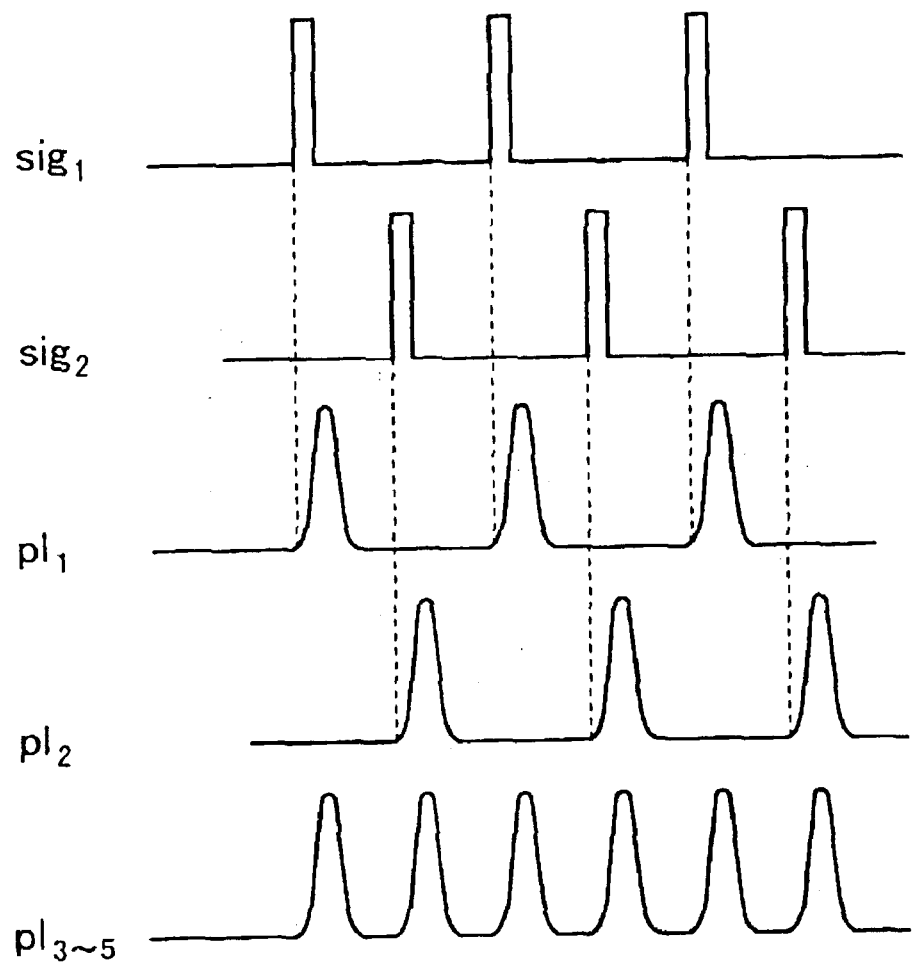
FIG. 2 is a timing chart showing the operation of a first control mode of the laser processing apparatus according to the embodiment.

FIG. 2 is a timing chart of the first control mode. The event signals $sig_1$ and $sig_2$ are pulse signals having the same frequency and synchronized with each other. The phase of the event signal $sig_2$ lags by 180 degrees from the phase of the event signal $sig_1$. The pulse laser beam $pl_1$ is synchronous with the event signal $sig_1$, whereas the pulse laser beam $pl_2$ is synchronous with the event signal $sig_2$. The pulse laser beam $pl_2$ lags therefore by 180° in phase from the pulse laser beam $pl_1$. The pulse repetition frequencies of the pulse laser beams $pl_3$ to $pl_5$ formed through combination of the pulse laser beams $pl_1$ and $pl_2$ are twice the frequency of the event signals $sig_1$ and $sig_2$.

Figure 4:
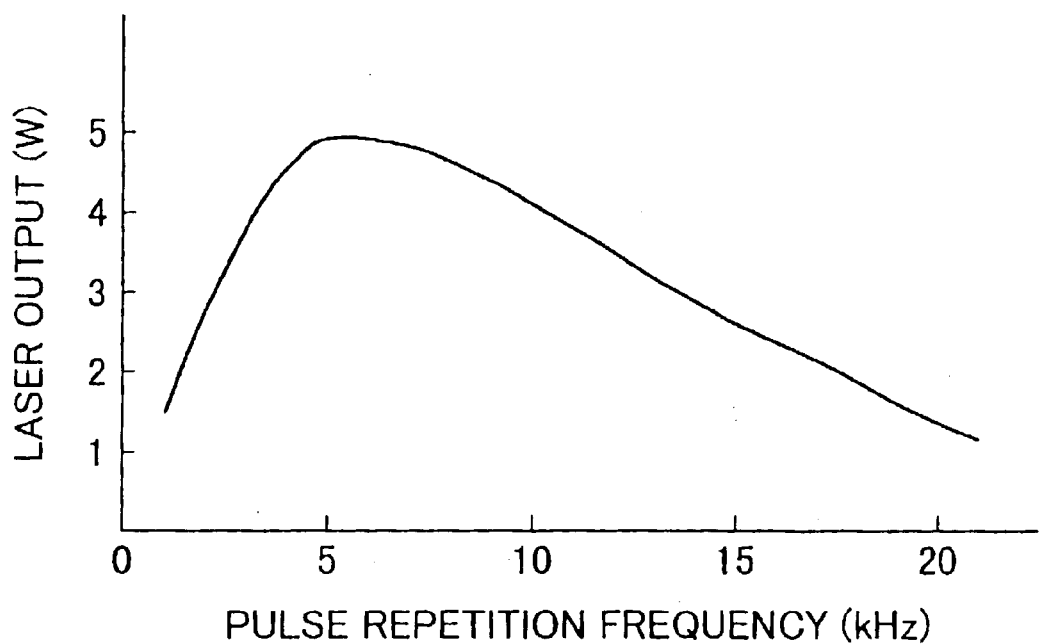
FIG. 4 is a graph showing an example of the output characteristics of a third harmonic wave of an Nd:YAG laser.

FIG. 4 is a graph showing an example of the output characteristics of a third harmonic wave of each of the first and second laser sources 1 and 2 using Nd:YAG laser oscillators. The abscissa represents a pulse repetition frequency in the unit of "kHz", and the ordinate represents a laser output in the unit of "W". At the repetition frequency of about 5 kHz, the laser output takes a maximum value. In the repetition frequency range not lower than 5 kHz, the laser output gradually lowers as the repetition frequency becomes high. This tendency is not limited only to an Nd:YAG laser oscillator, but other solid state lasers have similar tendency.

In order to form a hole in or through a resin film, an energy density per one pulse of a pulse laser beam is generally required to have some threshold value or higher. For example, if a hole is to be formed in an epoxy resin film, the energy density per one pulse is required to have about 1 J/cm² or higher. An energy per one pulse necessary for forming a hole is determined from the area of the hole. The energy per one pulse is given by P/f [J], where P [W] is an output of the pulse laser beam and f [Hz] is a pulse repetition frequency. The range where the energy P/f per one pulse takes the necessary threshold value or higher can be determined from the output characteristics shown in FIG. 4. If the laser sources 1 and 2 are operated in this range, a hole can be formed in a resin film.

The repetition frequency of the pulse laser beam $pl_5$ applied to the workpiece 20 is 10 kHz which is a twofold of the frequency of the event signals $sig_1$ and $sig_2$. The hole forming time can be shortened by about ½ as compared to using one laser oscillator.

Figure 3:
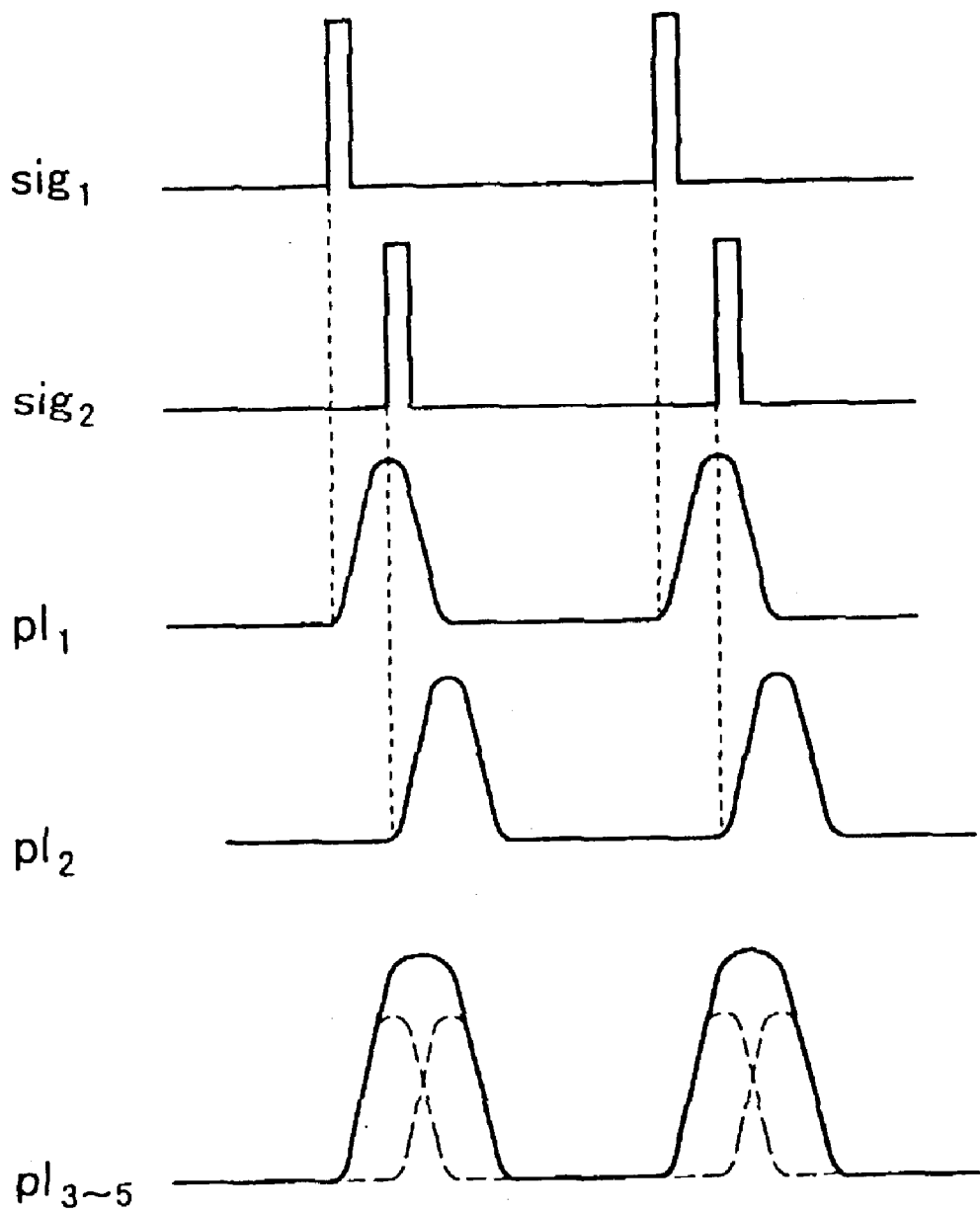
FIG. 3 is a timing chart showing the operation of a second control mode of the laser processing apparatus according to the embodiment.

FIG. 3 is a timing chart of the second control mode. In the first control mode shown in FIG. 2, the phase of the event signal $sig_2$ lags by 180° from the phase of the event signal $sig_1$. In the second control mode, the phase lag is small. Accordingly, the pulse laser beams $pl_1$ and $pl_2$ partially overlap to form the pulse laser beams $pl_3$ to $pl_5$ formed through combination of the pulse laser beams $pl_1$ and $pl_2$. The width of each pulse is hence broadened and the energy per one pulse is doubled. The phases of the event signals $sig_1$ and $sig_2$ may be set equal to completely superpose each pulse of the pulse laser beam $pl_1$ upon each pulse of the pulse laser beam $pl_2$. In this case, the pulse width does not broaden but the peak power is approximately doubled.

In order to form a hole in a copper foil, the energy density per one pulse is generally required to be about 10 J/cm² or higher. If the diameter of a hole is 100 μm, the energy per one pulse is required to be about $7.9 \times 10^{-4}$ J or higher. In the first control mode shown in FIG. 2, it is difficult to set the energy per one pulse to about $7.9 \times 10^{-4}$ J or higher. By partially overlapping the two pulse laser beams as shown in FIG. 3, the energy per one pulse necessary for forming a hole in a copper foil can be obtained.

Even if the energy per one pulse is insufficient, the necessary energy per one pulse may be obtained by converging the laser pulse and reducing the beam diameter. However, in this case, since the laser diameter is small, it is necessary to move the application position of the laser beam in order to form a hole having a desired size. For example, trepanning or spiral working becomes necessary. As in this embodiment, by increasing the energy per one pulse, a hole having a diameter of about 100 μm can be formed without trepanning or the like.

For example, if the repetition frequency is set to 10 kHz, the output of one laser source is about 4 W as determined from FIG. 4. The power of each of the laser beams $pl_3$ to $pl_5$ shown in FIG. 3 is therefore 8 W. The energy per one pulse is $8 \times 10^{-4}$ J. Although one laser source is difficult to form a hole in a copper foil, the energy per one pulse can be made sufficiently large for forming a hole in a copper foil by using two laser sources and superposing pulses.

The pulse width and peak intensity of the laser beams $pl_3$ to $pl_5$ shown in FIG. 3 depend on the phase difference between the pulse laser beams $pl_1$ and $pl_2$. By adjusting the phase difference between the event signals $sig_1$ and $sig_2$, the pulse width and peak intensity of the pulse laser beams $pl_3$ to $pl_5$ can be controlled with ease.

Figure 5:
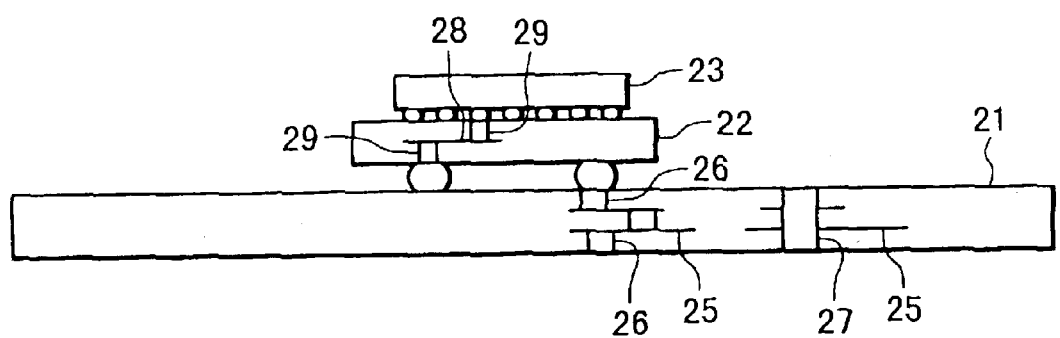
FIG. 5 is a cross sectional view of a multi-layer wiring substrate.

FIG. 5 is a cross sectional view of a multi-layer wiring substrate. A package board 22 is mounted on the surface of a mother board 21. A semiconductor integrated circuit chip 23 is mounted on the package board 22. The mother board 21 and package board 22 are made of epoxy resin which contains glass cloth.

Copper wiring layers 25 are formed embedded in the mother board 21. A via hole 26 extends from the surface of the mother board 21 to the copper wiring layer 25. A through hole 27 is formed through the mother board 21. Copper is filled in the via hole 26 and through hole 27. Similarly, a copper wiring layer 28 and a via hole 29 are formed in the package board 22. The via holes 26 and 29 and through hole 27 are formed by using the laser processing apparatus shown in FIG. 1. The laser processing is executed for separate mother board 21 and package board 22 before the latter 22 is mounted on the former 21.

The via holes 26 and 29 are formed in the first control mode shown in FIG. 2. In this case, the energy per one pulse of the pulse laser beam $pl_5$ is sufficiently large for forming a hole in the resin layer. However, since the energy is insufficient for forming a hole in the copper wiring layer, the copper wiring layer 25 is left unetched on the bottom of the via hole.

In order to form the through hole 27, after a hole is formed through the resin layer in the first control mode, another hole is formed through the copper wiring layer in the second control mode shown in FIG. 3. In this latter case, the energy per one pulse of the pulse laser beam $pl_5$ is sufficiently large for forming a hole in the copper foil layer. The through hole 27 can be formed in this manner by alternately repeating the laser processing in the first and second control modes.

If a hole is to be formed through a copper foil layer formed on the surface of a resin substrate, the hole is formed through the copper foil layer first in the second control mode. This laser processing can be stopped automatically when the hole is formed through the copper foil layer, by setting beforehand the number of pulses to be applied, in accordance with the thickness of the copper foil layer. After the hole is formed through the copper foil layer, then the mode is switched to the first control mode and another hole is formed through the resin layer. The number of pulses applied during the laser processing in the first control mode is also set beforehand.

In this embodiment, a third harmonic wave of an Nd:YAG laser is used as the pulse laser beam having a wavelength in the ultraviolet range. Other laser beams may also be used. For example, a fourth or fifth harmonic wave of an Nd:YAG laser may be used, and a YLF laser or $YVO_4$ laser may be used instead of an Nd:YAG laser. A fundamental wave of a KrF excimer laser or XeCl excimer laser may also be used.

Also in this embodiment, the pulse laser beam $pl_1$ radiated from the first laser source 1 and the pulse laser beam $pl_2$ radiated from the second laser source 2 are propagated along the same optical axis and converged at a working position of a workpiece. It is not necessarily required to propagate the pulse laser beams $pl_1$ and $pl_2$ along the same optical axis. For example, the first and second pulse laser beams $pl_1$ and $pl_2$ may be propagated along different optical axes which are crossed at the working position of a workpiece.

Figure 6:
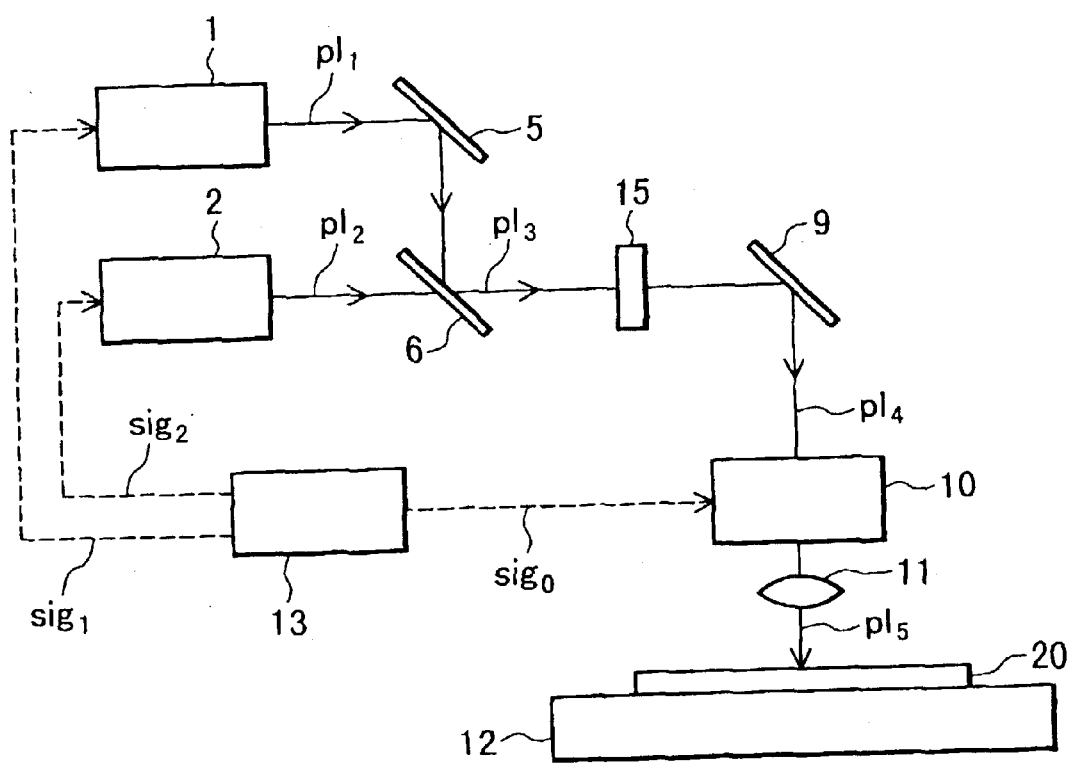
FIG. 6 is a block diagram showing a laser processing apparatus according to another embodiment of the invention.

Next, with reference to FIG. 6, another embodiment of the invention will be described. In the first embodiment, third harmonic waves of the two Nd:YAG lasers are combined, whereas in the second embodiment, fundamental waves are combined and then the third harmonic wave is formed. The fundamental structure of a laser processing apparatus shown in FIG. 6 is similar to that of the laser processing apparatus shown in FIG. 1. Only different points between the two apparatus will be described.

As shown in FIG. 6, first and second laser sources 1 and 2 radiate pulse laser beams $pl_1$ and $pl_2$ having a wavelength in the infrared or visual range. A non-linear optical component 15 is disposed on the optical axis of a pulse laser beam $pl_3$ formed through combination of the two pulse laser beams $pl_1$ and $pl_2$. The non-linear optical component 15 generates a harmonic wave, e.g., third harmonic wave, of the pulse laser beam $pl_3$. The non-linear optical component 15 may be disposed anywhere along the optical path of the pulse laser beam from a polarizer 6 to a workpiece 20.

The present invention has been described in connection with the preferred embodiments. The invention is not limited only to the above embodiments. It is apparent that various modifications, improvements, combinations, and the like can be made by those skilled in the art.

What is claimed is:

1. A laser processing method comprising the steps of:
   radiating a first pulse laser beam from a first laser source, the first pulse laser beam having a wavelength in an ultraviolet range;
   radiating a second pulse laser beam from a second laser source synchronously with the first pulse laser beam, the second pulse laser beam having a wavelength in the ultraviolet range; and
   applying the first and second pulse laser beams to a same processing area of a workpiece to form a hole in the same processing area.

2. A laser processing method according to claim 1, wherein in said step of forming a hole, a synchronous state between the first and second pulse laser beams is controlled in such a manner that pulses of the first and second pulse laser beams are alternately applied to the workpiece.

3. A laser processing method according to claim 1, wherein in said step of forming a hole, a synchronous state between the first and second pulse laser beams is controlled in such a manner that pulses of the first and second pulse laser beams are at least partially overlapped in the same processing area.

4. A laser processing method comprising the steps of:
   preparing a workpiece having a first layer and a second layer formed under the first layer, wherein a hole can be formed in the first layer by applying an ultraviolet pulse laser beam having a first energy per one pulse, and a hole can be formed in the second layer by applying an ultraviolet pulse laser beam having not the first energy per one pulse but a second energy per one pulse higher than the first energy;
   applying a first pulse laser beam and a second pulse laser beam to the first layer in a processing area thereof under a timing condition that pulses of the first and second pulse laser beams are alternately applied to the first layer, to form a first hole in the first layer and expose a partial surface of the second layer under the first layer, the first pulse laser beam being radiated from a first laser source and having a wavelength in an ultraviolet range, and the second pulse laser beam being radiated from a second laser source and having a wavelength in the ultraviolet range; and
   applying the first and second pulse laser beams to the second layer exposed on a bottom of the first hole under a timing condition that pulses of the first and second pulse laser beams are at least partially overlapped, to form a second hole in the second layer, the first pulse laser beam being radiated from the first laser source and having the wavelength in the ultraviolet range, and the second pulse laser beam being radiated from the second laser source and having the wavelength in the ultraviolet range.

* * * * *